United States Patent
Lin

(10) Patent No.: US 10,083,975 B2
(45) Date of Patent: Sep. 25, 2018

(54) CONTROL VOLTAGE SEARCHING METHOD FOR NON-VOLATILE MEMORY

(71) Applicant: eMemory Technology Inc., Hsin-Chu (TW)

(72) Inventor: Yih-Lang Lin, Taipei (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 0 days.

(21) Appl. No.: 15/631,444

(22) Filed: Jun. 23, 2017

(65) Prior Publication Data
US 2018/0102174 A1 Apr. 12, 2018

Related U.S. Application Data
(60) Provisional application No. 62/406,968, filed on Oct. 12, 2016.

(51) Int. Cl.
| | | |
|---|---|---|
| *G11C 29/50* | (2006.01) | |
| *H01L 27/11524* | (2017.01) | |
| *H01L 23/31* | (2006.01) | |
| *H01L 23/528* | (2006.01) | |
| *H01L 29/06* | (2006.01) | |
| *H01L 29/49* | (2006.01) | |
| *G11C 7/14* | (2006.01) | |
| *G11C 16/28* | (2006.01) | |
| *G11C 16/10* | (2006.01) | |
| *G11C 16/30* | (2006.01) | |
| *G11C 16/34* | (2006.01) | |
| *G11C 29/02* | (2006.01) | |

(52) U.S. Cl.
CPC .......... *H01L 27/11524* (2013.01); *G11C 7/14* (2013.01); *G11C 16/10* (2013.01); *G11C 16/28* (2013.01); *G11C 16/30* (2013.01); *G11C 16/3459* (2013.01); *G11C 29/021* (2013.01); *G11C 29/028* (2013.01); *H01L 23/3171* (2013.01); *H01L 23/528* (2013.01); *H01L 29/0649* (2013.01); *H01L 29/4916* (2013.01); *H01L 29/4975* (2013.01)

(58) Field of Classification Search
CPC ........ G11C 29/50; G11C 11/401; G11C 29/02
USPC ....................................................... 365/201
See application file for complete search history.

(56) References Cited

U.S. PATENT DOCUMENTS

| | | | |
|---|---|---|---|
| 8,369,154 B2 | 2/2013 | Chen et al. | |
| 2009/0016116 A1* | 1/2009 | Lo .......................... | G11C 16/10 365/185.22 |
| 2013/0208543 A1 | 8/2013 | Park | |

* cited by examiner

*Primary Examiner* — Jason Lappas
(74) *Attorney, Agent, or Firm* — WPAT, PC

(57) ABSTRACT

A control voltage searching method is provided. Firstly, a control pulse with a preset control voltage and a preset pulse width is generated, and a control action on a memory cell. If the pulse count of the control pulse is smaller than a first number, the control voltage plus a first increment is set as an updated value of the control voltage. If the pulse count of the control pulse is not smaller than a first number, a first-stage verifying action is performed to judge whether the memory cell passes a first-stage verification test. If the memory cell passes the first-stage verification test, a second-stage verifying action is performed to judge whether the memory cell passes a second-stage verification test. If the memory cell passes the second-stage verification test, a target value of the control voltage is acquired.

17 Claims, 7 Drawing Sheets

FIG. 2A
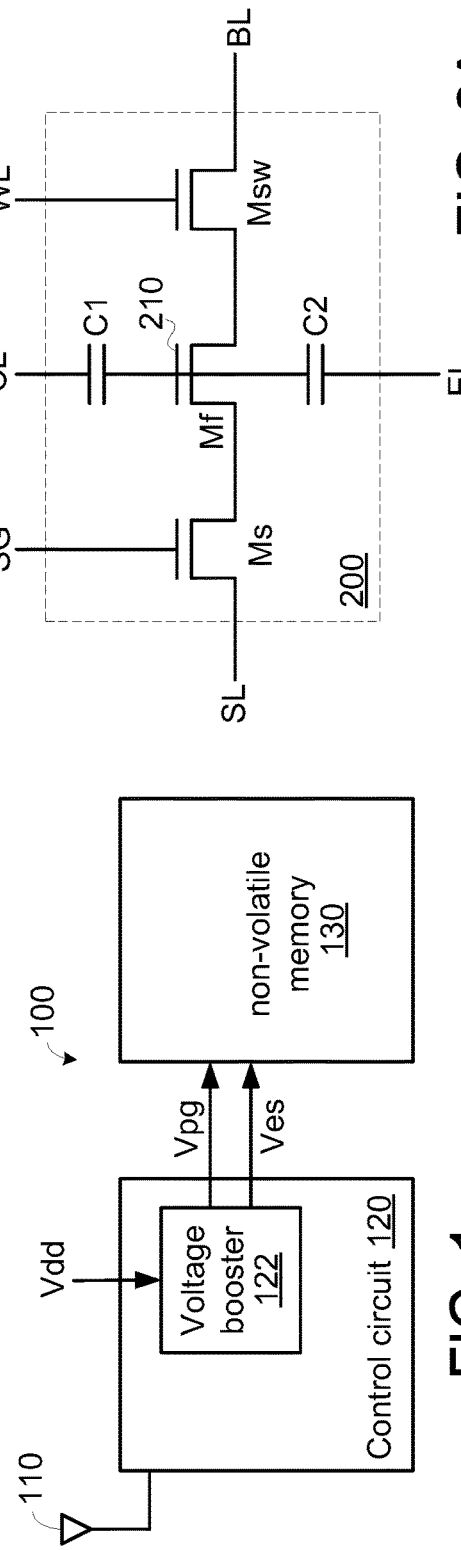
FIG. 1
(PRIOR ART)
| | CL | EL | WL | SG | BL | SL |
|---|---|---|---|---|---|---|
| PGM | Vpg | Vpg | Vdd | Vdd | 0V | 0V |
| PGM Verify | Vdd | Vdd | Vdd | Vdd | Vbias | 0V |
| ERS | 0V | Ves | Vdd | Vdd | 0V | 0V |
| ERS Verify | 0V | 0V | Vdd | Vdd | Vbias | 0V |
FIG. 2B

CONTROL VOLTAGE SEARCHING METHOD FOR NON-VOLATILE MEMORY

This application claims the benefit of U.S. provisional application Ser. No. 62/406,968, filed Oct. 12, 2016, the disclosure of which is incorporated by reference herein in its entirety.

FIELD OF THE INVENTION

The present invention relates to a control method for a memory, and more particularly to a control voltage searching method for a non-volatile memory.

BACKGROUND OF THE INVENTION

As is well known, a non-volatile memory is able to continuously retain data after the supplied power is interrupted. Consequently, the non-volatile memory is widely used in a variety of electronic devices.

For example, a radio frequency identification (RFID) circuit uses radio waves to transfer identification data in order to identify an object. Generally, the RFID circuit is equipped with a non-volatile memory to store the identification data.

FIG. 1 schematically illustrates a RFID circuit. As shown in FIG. 1, the RFID circuit 100 comprises an antenna 110, a control circuit 120 and a non-volatile memory 130. Generally, the identification data are stored in the non-volatile memory 130. During the normal operations of the RFID circuit 100, the control circuit 120 reads the identification data from the non-volatile memory 130. In addition, the identification data are transmitted to an external receiver (not shown) through the antenna 110.

Moreover, the identification data in the non-volatile memory 130 can be modified by the control circuit 120. For modifying the identification data, the control circuit 120 firstly performs an erase action to delete the old identification data of the non-volatile memory 130 and then performs a program action to store the updated identification data into the non-volatile memory 130.

While the control circuit 120 performs the erase action to delete the old identification data of the non-volatile memory 130, the control circuit 120 provides an erase voltage Ves to the non-volatile memory 130. In response to the erase voltage Ves, the old identification data of the non-volatile memory 130 are deleted.

While the control circuit 120 performs the program action to store the updated identification data into the non-volatile memory 130, the control circuit 120 provides a program voltage Vpg to the non-volatile memory 130. In response to the program voltage Vpg, the updated identification data are stored into the non-volatile memory 130.

Moreover, the control circuit 120 receives a power voltage Vdd. Generally, the magnitude of the power voltage Vdd is much lower than the magnitude of the program voltage Vpg and the magnitude of the erase voltage Ves. The control circuit 120 is usually equipped with a voltage booster 122 such as a charge pump. After the magnitude of the power voltage Vdd is multiplied by specified factors, the program voltage Vpg and the erase voltage Ves are generated. In such way, the program voltage Vpg and the erase voltage Ves can be provided to the non-volatile memory 130.

For example, the magnitude of the power voltage Vdd is 2.0V. After the magnitude of the power voltage Vdd is multiplied by 5, the magnitude of the program voltage Vpg is 10V. After the magnitude of the power voltage Vdd is multiplied by 3.5, the magnitude of the erase voltage Ves is 7V.

For allowing the non-volatile memory 130 to be normally operated, the proportion of the power voltage Vdd to the program voltage Vpg and the proportion of the power voltage Vdd to the erase voltage Ves should be previously realized by the control circuit 120. Consequently, the voltage booster 122 is designed according to these proportions.

However, some electronic devices are powered by a wide range power voltage. For example, the power voltage received by the RFID circuit is in a wide range between 1.2V and 2.5V. As long as the power voltage Vdd received by the RFID circuit is in the range between 1.2V and 2.5V, the RFID circuit can be normally operated.

Since the RFID circuit is unable to predict the magnitude of the received power voltage Vdd, some problems occur. For example, if the voltage booster 122 of the control circuit 120 as shown in FIG. 1 is used to generate the program voltage Vpg and the erase voltage Ves, the non-volatile memory 130 is not normally operated or even the non-volatile memory 130 is burnt out.

For example, if the power voltage Vdd received by the control circuit 120 is 1.2V, the voltage booster 122 generates a 6.0V-program voltage Vpg (e.g., multiple=5) and a 4.2V-erase voltage Ves (e.g., multiple=3.5). Since the magnitudes of the 6.0V-program voltage Vpg and the 4.2V-erase voltage Ves are too low, the erase action or the program action of the non-volatile memory 130 cannot be successfully done.

On the other hand, if the power voltage Vdd received by the control circuit 120 is 2.5V, the voltage booster 122 generates a 12.5V-program voltage Vpg (e.g., multiple=5) and an 8.75V-erase voltage Ves (e.g., multiple=3.5). Since the magnitudes of the 12.5V-program voltage Vpg and the 8.75V-erase voltage Ves are too high, the non-volatile memory 130 cannot withstand these high voltages. Under this circumstance, the memory cells of the non-volatile memory 130 are possibly burnt out.

SUMMARY OF THE INVENTION

An embodiment of the present invention provides a control voltage searching method for a non-volatile memory. The control voltage searching method can be applied to the electronic devices that are powered by a wide range power voltage. The control voltage searching method is capable of searching the program voltage and the erase voltage for the non-volatile memory of the electronic device. Consequently, the erase action and the program action of the non-volatile memory can be normally performed.

An embodiment of the present invention provides a control voltage searching method for a non-volatile memory. The control voltage searching method includes the following steps. In a step (a1), a preset control voltage and a preset pulse width are provided. In a step (a2), a control pulse is generated according to the control voltage and the pulse width, and a control action on a memory cell. An amplitude of the control pulse is equal to the control voltage. Then, a step (a3) is performed to judge whether a pulse count of the control pulse is smaller than a first number. If the pulse count of the control pulse is smaller than the first number, the control voltage plus a first increment is set as an updated value of the control voltage, and the step (a2) is repeatedly done. If the pulse count of the control pulse is not smaller than the first number, a first-stage verifying action is performed to judge whether the memory cell passes a first-stage verification test. In a step (a4), if the memory cell does not pass the first-stage verification test, the control voltage plus the first increment is set as an updated value of the control voltage, and the step (a2) is performed again. If the memory cell passes the first-stage verification test, a second-stage verifying action is performed to judge whether the memory cell passes a second-stage verification test. In a step, (a5) if the memory cell passes the second-stage verification test, a target value of the control voltage is acquired according to the updated value of the control voltage.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 1 (prior art) schematically illustrates a RFID circuit;

FIG. 2A is a schematic circuit diagram illustrating a memory cell of a non-volatile memory according to an embodiment of the present invention;

FIG. 2B schematically illustrates associated voltage signals for performing various actions of the memory cell of FIG. 2A;

DETAILED DESCRIPTION OF PREFERRED EMBODIMENTS

Figure 3A:
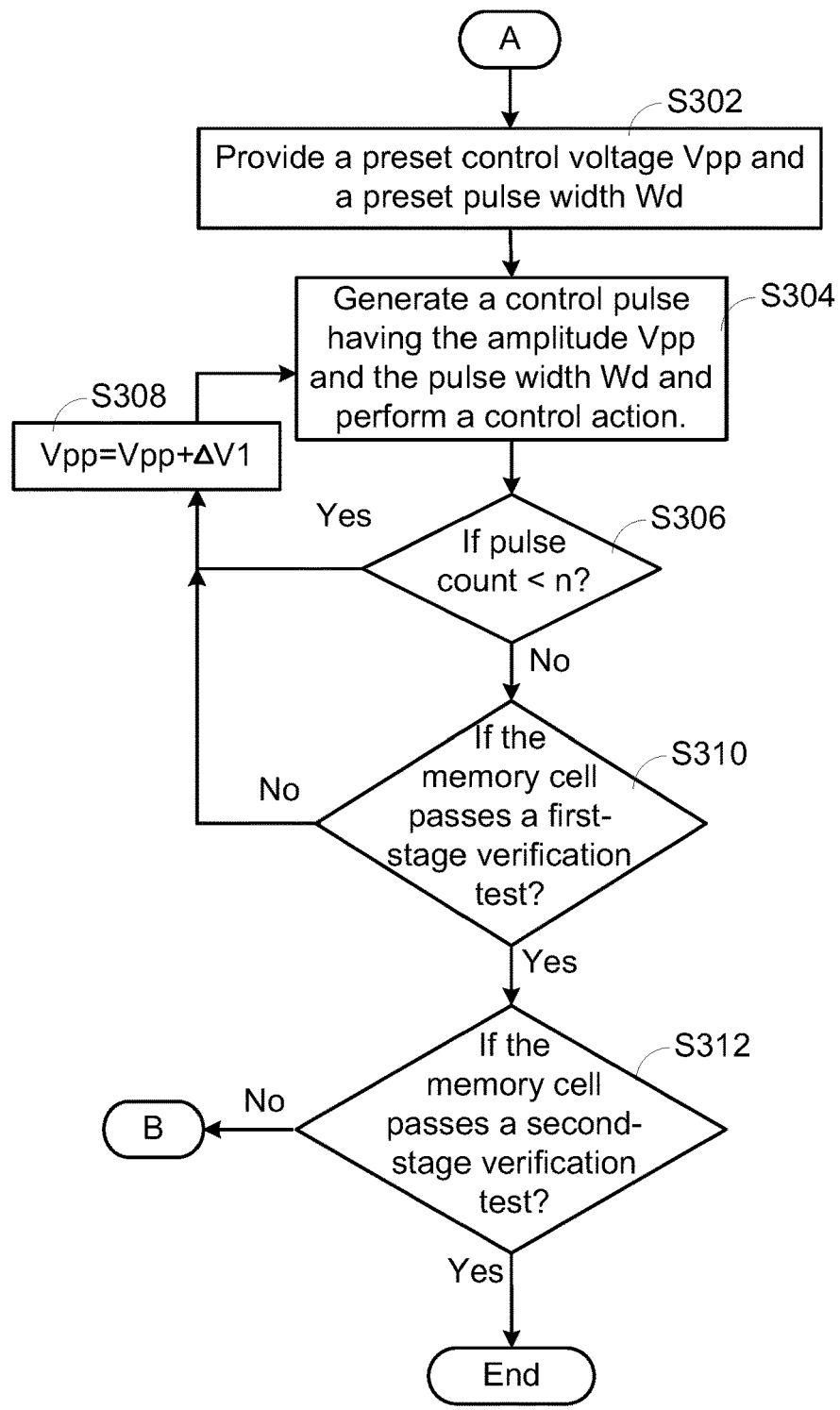
FIGS. 3A, 3B and 3C schematically illustrate a control voltage searching method for a non-volatile memory according to the first embodiment of the present invention.

As is well known, a non-volatile memory comprises a memory cell array. The memory cell array consists of plural memory cells. In addition, each memory cell has a floating gate transistor. Hereinafter, a memory cell comprising N-type electronic components is taken as an example in order to describe the operations of the memory cell.

FIG. 2A is a schematic circuit diagram illustrating a memory cell of a non-volatile memory according to an embodiment of the present invention. FIG. 2B schematically illustrates associated voltage signals for performing various actions of the memory cell of FIG. 2A.

As shown in FIG. 2A, the memory cell 200 comprises a switch transistor Msw, a floating gate transistor Mf, a select transistor Ms, a first capacitor C1 and a second capacitor C2. These transistors are n type transistors.

A first source/drain terminal of the select transistor Ms is connected with a source line SL. A gate terminal of the select transistor Ms is connected with a select gate line SG. A first source/drain terminal of the switch transistor Msw is connected with a bit line BL. A gate terminal of the switch transistor Msw is connected with a word line WL. A first source/drain terminal of the floating gate transistor Mf is connected with a second source/drain terminal of the select transistor Ms. A second source/drain terminal of the floating gate transistor Mf is connected with a second source/drain terminal of the switch transistor Msw. The first capacitor C1 is connected between a floating gate 210 of the floating gate transistor Mf and a control line CL. The second capacitor C2 is connected between the floating gate 210 of the floating gate transistor Mf and an erase line EL. Moreover, the body terminals (not shown) of the switch transistor Msw, the floating gate transistor Mf and the select transistor Ms are selectively connected with a ground voltage.

Please refer to FIG. 2B. For programming the memory cell 200, the program voltage Vpg is provided to the control line CL and the erase line EL, the power voltage Vdd is provided to the word line WL and the select gate line SG, and a ground voltage (0V) is provided to the bit line BL and the source line SL. Consequently, hot carriers are injected into the floating gate 210 of the memory cell 200, and a threshold voltage of the floating gate transistor Mf is increased.

In the withstanding voltage range of the floating gate transistor Mf, the higher program voltage Vpg indicates that more hot carriers are injected into the floating gate 210. Since the threshold voltage of the floating gate transistor Mf is increased, it is more difficult to turn on the floating gate transistor Mf. In this situation, the programmed level of the memory cell 200 is better.

Moreover, a program verifying action is employed to judge the programmed level of the memory cell 200. For performing the program verifying action on the memory cell 200, the power voltage Vdd is provided to the control line CL, the erase line EL, the word line WL and the select gate line SG, a bias voltage Vbias is provided to the bit line BL, and the ground voltage (0V) is provided to the source line SL.

After the memory cell 200 is programmed, the threshold voltage of the floating gate transistor Mf is increased and the floating gate transistor Mf is turned on more difficultly. Consequently, in the program verifying action, the control circuit judges the programmed level of the memory cell 200 according to an off current generated by the floating gate transistor Mf. Generally, the off current flows from the bit line BL to the source line SL through the switch transistor Msw, the floating gate transistor Mf and the select transistor Ms. The lower off current denotes the better programmed level of the memory cell 200.

For example, if the off current is higher than 60 μA, the memory cell 200 does not pass the program verification test and thus the program action fails. If the off current is lower than 60 μA, the memory cell 200 passes the lowest acceptable level of the program verification test and the programmed level of the memory cell 200 is fair. If the off current is lower than 30 μA, the memory cell 200 passes the program verification test and thus the programmed level of the memory cell 200 is satisfactory.

Please refer to FIG. 2B again. For erasing the memory cell 200, a ground voltage (0V) is provided to the control line CL, the erase voltage Ves is provided to the erase line EL, the power voltage Vdd is provided to the word line WL and the select gate line SG, and the ground voltage (0V) is provided to the bit line BL and the source line SL. Consequently, the hot carriers are ejected from the floating gate 210 of the memory cell 200, and the threshold voltage of the floating gate transistor Mf is decreased.

In the withstanding voltage range of the floating gate transistor Mf, the higher erase voltage Ves indicates that more hot carriers are ejected from the floating gate 210. Since the threshold voltage of the floating gate transistor Mf is decreased, it is easier to turn on the floating gate transistor Mf. In this situation, the erased level of the memory cell 200 is better.

Moreover, an erase verifying action is employed to judge the erased level of the memory cell 200. For performing the erase verifying action on the memory cell 200, the ground voltage (0V) is provided to the control line CL, the erase line EL and the source line SL, the power voltage Vdd is provided to the word line WL and the select gate line SG, and a bias voltage Vbias is provided to the bit line BL. The magnitude of the bias voltage Vbias is lower than the magnitude of the power voltage Vdd.

After the memory cell 200 is erased, the threshold voltage of the floating gate transistor Mf is decreased and the floating gate transistor Mf is turned on more easily. Consequently, in the erase verifying action, the control circuit judges the erased level of the memory cell 200 according to an on current generated by the floating gate transistor Mf. Generally, the on current flows from the bit line BL to the source line SL through the switch transistor Msw, the floating gate transistor Mf and the select transistor Ms. The higher on current denotes the better erased level of the memory cell 200.

For example, if the on current is lower than 10 µA, the memory cell 200 does not pass the erase verification test and thus the erase action fails. If the on current is higher than 10 µA, the memory cell 200 passes the lowest acceptable level of the erase verification test and the erased level of the memory cell 200 is fair. If the on current is higher than 30 µA, the memory cell 200 passes the erase verification test and thus the erased level of the memory cell 200 is satisfactory.

According to the above characteristics of the non-volatile memory, the present invention provides a control voltage searching method for the non-volatile memory. The control voltage searching method can be applied to the electronic devices that are powered by a wide range power voltage. In case that a control circuit of the electronic device is unable to realize the accurate magnitude of the power voltage Vdd, the control circuit increases a control voltage gradually and performs a control action and a verifying action on the non-volatile memory. Consequently, the target control voltage for the non-volatile memory is searched. In an embodiment, the control action is a program action or an erase action, and the control voltage is a program voltage or an erase voltage.

In another embodiment, the memory cell maybe designed by p type transistors and capacitors. In the program verifying action, the control circuit should judge the programmed level of the memory cell according to the on current generated by the floating gate transistor. The higher on current denotes the better programmed level of the memory cell. In the erase verifying action, the control circuit should judge the erased level of the memory cell according to the off current generated by the floating gate transistor. The lower off current denotes the better erased level of the memory cell.

Figure 3C:
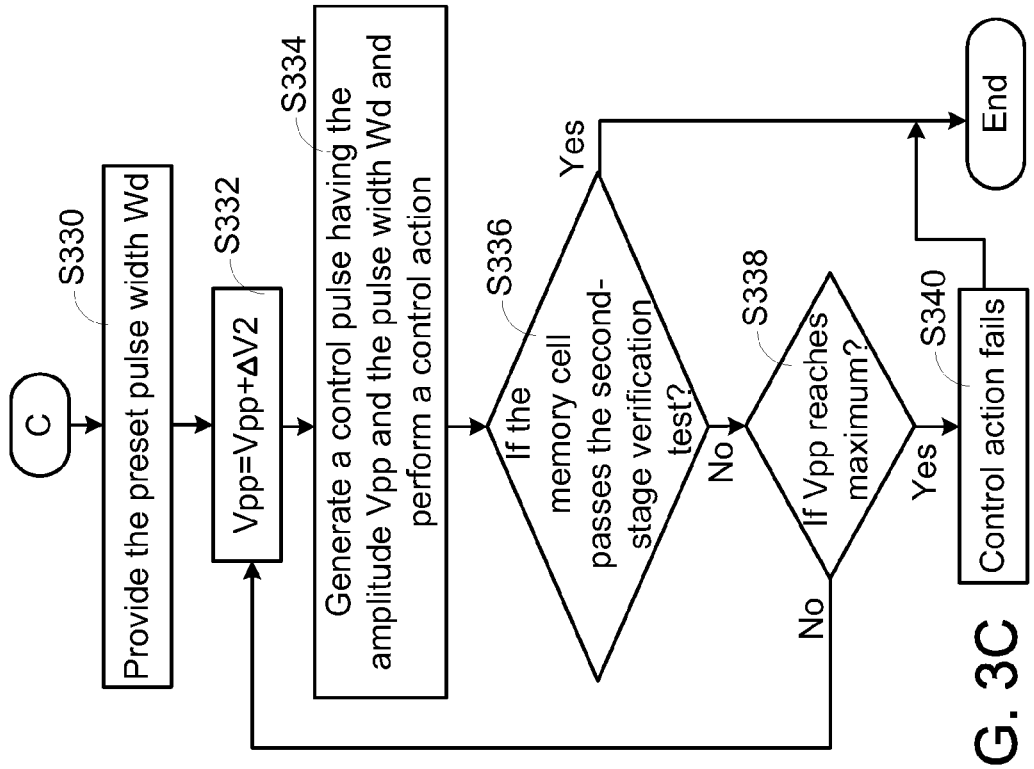
Figure 3B:
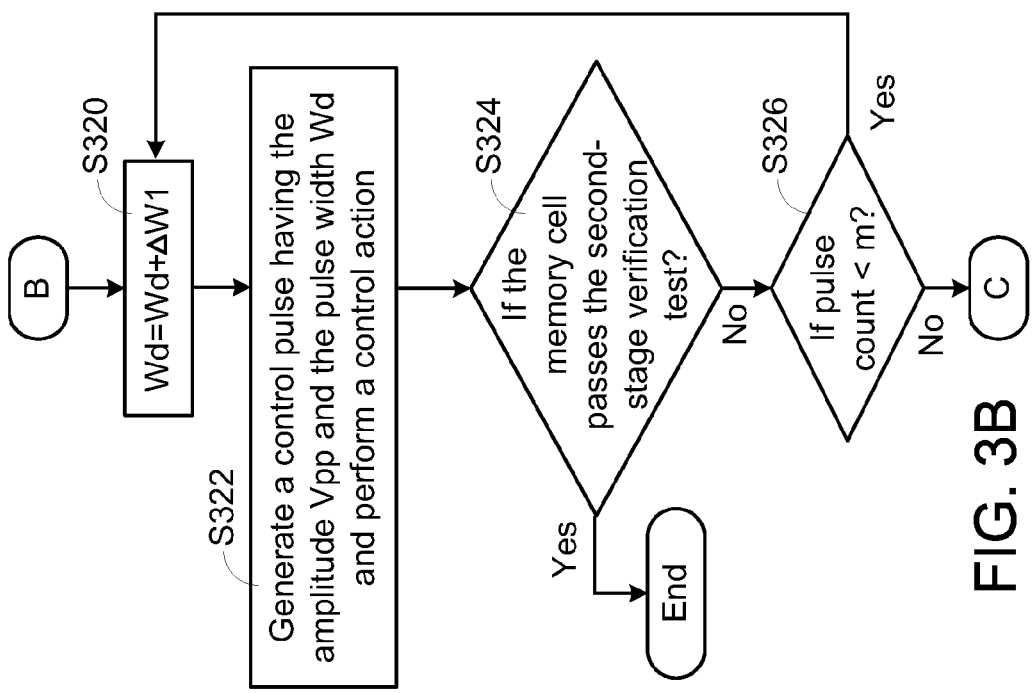

FIGS. 3A, 3B and 3C schematically illustrate a control voltage searching method for a non-volatile memory according to the first embodiment of the present invention. The control voltage searching method comprises three searching processes A, B and C. Firstly, the control circuit performs the searching process A. If the control voltage is not acquired by the searching process A, the control circuit continuously performs the searching process B. If the control voltage is not acquired by the searching process B, the control circuit continuously performs the searching process C. On the other hand, if the control voltage is acquired by the searching process A, the control circuit does not need to continuously perform the searching processes B and C. Similarly, if the control voltage is acquired by the searching process B, the control circuit does not need to continuously perform the searching process C.

The flowchart of the searching process A of the control voltage searching method is shown in FIG. 3A. After the electronic device receives the power voltage Vdd and the control circuit starts to search the control voltage of the non-volatile memory, the searching process A is performed. In a step S302, the control circuit provides a preset control voltage Vpp and a preset pulse width Wd. The preset control voltage Vpp is a fixed multiple of the power voltage Vdd. For example, the preset control voltage Vpp is 2×Vdd. Moreover, the preset pulse width Wd is 10 ms for example.

In the step S304, the control circuit generates a control pulse having the amplitude Vpp and the pulse width Wd, and the control circuit performs a control action on the memory cell. For example, the control action is a program action or an erase action. While the control circuit searches the erase voltage, the control circuit generates an erase pulse and performs the erase action on the memory cell. Similarly, while the control circuit searches the program voltage, the control circuit generates a program pulse and performs the program action on the memory cell.

In a step S306, the control circuit judges whether the pulse count of the control pulse is smaller than n. If the judging condition of the step S306 is satisfied, the original control voltage Vpp plus an increment $\Delta V1$ is set as the updated control voltage Vpp (Step S308). That is, Vpp=Vpp+$\Delta V1$. In addition, the step S304 is repeatedly done. In an embodiment, the increment $\Delta V1$ is a fixed multiple of the power voltage Vdd. For example, the increment $\Delta V1$=0.5×Vdd.

If the judging condition of the step S306 is not satisfied (i.e., the pulse count is not smaller than n), the control circuit performs a first-stage verifying action to judge whether the memory cell passes a first-stage verification test (Step S310). If the memory cell cannot pass the first-stage verification test, the step S308 is repeatedly done to update the control voltage Vpp.

If the memory cell passes the first-stage verification test, the control circuit performs a second-stage verifying action to judge whether the memory cell passes a second-stage verification test (Step S312). If the memory cell passes the second-stage verification test, the control circuit acquires a target value of the control voltage and ends the flowchart. Whereas, if the memory cell cannot pass the second-stage verification test, the control circuit performs the searching process B.

In accordance with the present invention, the first-stage verification test is the lowest acceptable level for verifying the memory cell, and the second-stage verification test is a higher acceptable level for verifying the memory cell.

Take the program verifying action of the memory cell 200 of FIG. 2A for example. If the off current is lower than 60 µA (lowest acceptable level), the memory cell 200 passes the first-stage verification test. If the off current is lower than 30 µA (higher acceptable level), the memory cell 200 passes the second-stage verification test.

In other words, the control line CL and erase line EL of the memory cell 200 are applied with same bias conditions (Vdd) during the first-stage verification test and the second-stage verification test, the memory cell 200 is determined if it passes the first-stage verification test/the second-stage verification according to a comparison between the Ioff current of the memory cell 200 and the lower acceptance level/the higher acceptance level. As the example described above, the lower acceptance level is 60 μA while the higher acceptance level is 30 μA.

In an alternative embodiment, the first-stage verification test and second-stage verification test may be performed in the below way. The acceptance level of the first-stage verification test and that of the second-stage verification test are set to a same current level (for example 30 μA). The control line CL and the erase line EL of the memory 200 receive half the power voltage Vdd (0.5×Vdd), and the memory cell 200 passes the first-stage verification test if the off current the memory cell 200 is lower than the acceptance level (30 μA). Moreover, the control line CL and the erase line EL of the memory cell 200 receive the power voltage Vdd, and, the memory cell 200 passes the second-stage verification test if the off current of the memory cell 200 is lower than the acceptance level (30 μA). That is, the acceptance level for the first-stage and that of second-stage verification test are set to be the same, the control line CL and the erase line EL of the memory cell 200 are applied with different bias conditions (0.5Vdd and Vdd) during the first-stage and second-stage verification test, then the memory cell 200 is determined if it passes the first-stage verification test/the second-stage verification according to a comparisons between the Ioff current of the memory cell 200 and the acceptance level.

Take the erase verifying action of the memory cell 200 of FIG. 2A for example. If the on current is higher than 10 μA, the memory cell 200 passes the first-stage verification test. If the on current is higher than 30 μA, the memory cell 200 passes the second-stage verification test.

The flowchart of the searching process B of the control voltage searching method is shown in FIG. 3B. When the control circuit starts the searching process B, it means that the memory cell passes the first-stage verification test but unable to pass the second-stage verification test.

In a step S320, the preset pulse width Wd plus an increment $\Delta W1$ is set as the updated pulse width. That is, Wd=Wd+$\Delta W1$.

In the step S322, the control circuit generates a control pulse having the amplitude Vpp and the pulse width Wd, and the control circuit performs a control action on the memory cell. For example, the control action is a program action or an erase action. While the control circuit searches the erase voltage, the control circuit generates an erase pulse performs the erase action on the memory cell. Similarly, while the control circuit searches the program voltage, the control circuit generates a program pulse performs the program action on the memory cell.

In a step S324, the control circuit performs the second-stage verifying action to judge whether the memory cell passes the second-stage verification test. If the memory cell passes the second-stage verification test, the control circuit acquires a target value of the control voltage and ends the flowchart.

If the memory cell cannot pass the second-stage verification test, the control circuit judges whether the pulse count of the control pulse is smaller than m (Step S326). If the judging condition of the step S326 is satisfied, the step S320 is repeatedly done to update the pulse width Wd. Whereas, if the judging condition of the step S326 is not satisfied, the control circuit continuously performs the searching process C.

In the searching process B, the control voltage Vpp is kept unchanged but the pulse width Wd is changed. The control circuit performs the control action on the memory cell. According to the result of the control action, the control circuit judges whether the memory cell passes the second-stage verification test.

The flowchart of the searching process C of the control voltage searching method is shown in FIG. 3C. When the control circuit starts the searching process C, it means that the memory cell does not pass the second-stage verification test by changing the pulse width Wd of the control pulse.

In a step S330, the control circuit provides the preset pulse width Wd.

In a step S332, the original control voltage Vpp plus an increment $\Delta V2$ is set as the updated control voltage Vpp. That is, Vpp=Vpp+$\Delta V2$. In an embodiment, the increment $\Delta V2$ is also a fixed multiple of the power voltage Vdd. For example, the increment $\Delta V2$=0.3×Vdd.

In the step S334, the control circuit generates a control pulse having the amplitude Vpp and the pulse width Wd, and the control circuit performs a control action on the memory cell.

In a step S336, the control circuit performs the second-stage verifying action to judge whether the memory cell passes the second-stage verification test. If the memory cell passes the second-stage verification test, the control circuit acquires a target value of the control voltage and ends the flowchart.

If the memory cell cannot pass the second-stage verification test, the control circuit judges whether the control voltage Vpp reaches a maximum value (Step 338). If the control voltage Vpp does not reach the maximum value, the step S332 is repeatedly done to update the control voltage Vpp. Whereas, if the control voltage Vpp reaches the maximum value, the control circuit confirms that the control action fails (Step S340) and ends the flowchart. In an embodiment, the maximum value is a fixed multiple of the power voltage Vdd. For example, the maximum value is 8×Vdd.

In the searching process C, the pulse width Wd is kept unchanged but the amplitude of the control voltage Vpp is changed. The control circuit performs the control action on the memory cell. According to the result of the control action, the control circuit judges whether the memory cell passes the second-stage verification test.

Some implementation examples of the control voltage searching method will be described as follows. In these examples, the control voltage searching method is used for searching the erase voltage of the memory cell 200 of FIG. 2A. Moreover, n=3, m=9, the preset control voltage Vpp is 2Vdd, the increment $\Delta V1$ is 0.5Vdd, the preset pulse width Wd is 10 ms, the increment $\Delta W1$ is 3 ms, and the increment $\Delta V2$ is 0.3Vdd. The first-stage verification test is the lowest acceptable level for verifying the memory cell, and the second-stage verification test is a higher acceptable level for verifying the memory cell. It is noted that the above parameters may be varied according to the practical requirements.

FIGS. 4A~4D are schematic timing diagrams illustrating the changes of the erase voltage processed by the control voltage searching method of the present invention in different situations.

Figure 4A:
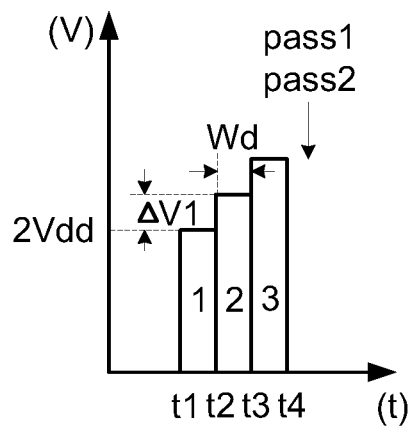
FIGS. 4A~4D are schematic timing diagrams illustrating the changes of the erase voltage processed by the control voltage searching method of the present invention in different situations.

A method of acquiring the erase voltage in the searching process A is shown in FIG. 4A. In the time interval between the time point t1 and the time point t4, the control circuit generates three consecutive erase pulse (n=3) and performs the erase action three times. Consequently, the amplitudes of the three erase pulses are 2Vdd, 2.5Vdd (=2Vdd+$\Delta V1$) and 3Vdd (=2Vdd+2$\Delta V1$), respectively. At the time point the time point t4, the control circuit performs the erase verifying action. The result of the erase verifying action indicates that the memory cell pass the first-stage verification test (pass1) and the second-stage verification test (pass2). Consequently, the target value of the erase voltage Ves is 3Vdd.

Figure 4B:
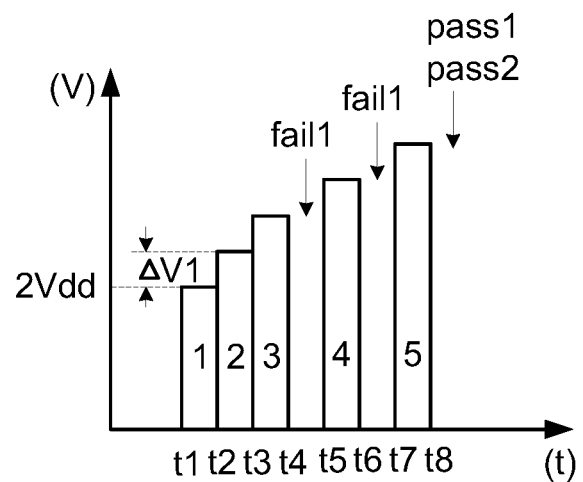

Another method of acquiring the erase voltage in the searching process A is shown in FIG. 4B. In the time interval between the time point t1 and the time point t4, the control circuit generates three consecutive erase pulse (n=3) and performs the erase action three times. Consequently, the amplitudes of the three erase pulses are 2Vdd, 2.5Vdd and 3Vdd, respectively.

At the time point the time point t4, the control circuit performs the erase verifying action. The result of the erase verifying action indicates that the memory cell does not pass the first-stage verification test (fail1). At the time point t5, the control circuit generates a fourth erase pulse and performs the erase action on the memory cell. Consequently, the amplitude of the fourth erase pulse is 3.5Vdd (=2Vdd+3ΔV1).

At the time point t6, the control circuit performs the erase verifying action. The result of the erase verifying action indicates that the memory cell does not pass the first-stage verification test (fail1). At the time point t7, the control circuit generates a fifth erase pulse and performs the erase action on the memory cell. Consequently, the amplitude of the fourth erase pulse is 4Vdd (=2Vdd+4ΔV1).

At the time point t8, the control circuit performs the erase verifying action. The result of the erase verifying action indicates that the memory cell pass the first-stage verification test (pass1) and the second-stage verification test (pass2). Consequently, the target value of the erase voltage Ves is 4Vdd.

Figure 4C:
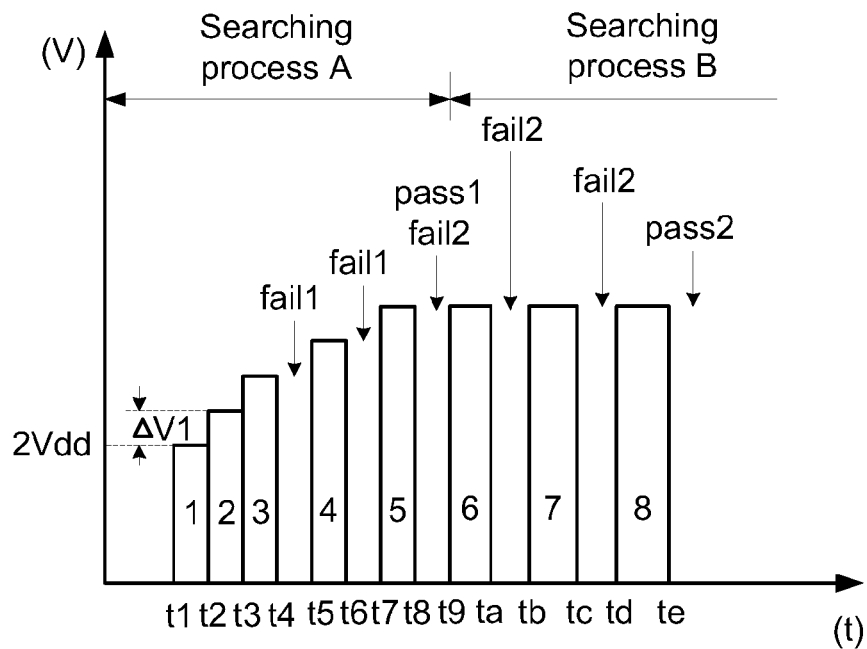

A method of acquiring the erase voltage in the searching process A and the searching process B is shown in FIG. 4C. In the time interval between the time point t1 and the time point t4, the control circuit generates three consecutive erase pulse (n=3) and performs the erase action three times. Consequently, the amplitudes of the three erase pulses are 2Vdd, 2.5Vdd and 3Vdd, respectively.

At the time point the time point t4, the control circuit performs the erase verifying action. The result of the erase verifying action indicates that the memory cell does not pass the first-stage verification test (fail1). At the time point t5, the control circuit generates a fourth erase pulse and performs the erase action on the memory cell. Consequently, the amplitude of the fourth erase pulse is 3.5Vdd.

At the time point t6, the control circuit performs the erase verifying action. The result of the erase verifying action indicates that the memory cell does not pass the first-stage verification test (fail1). At the time point t7, the control circuit generates a fifth erase pulse and performs the erase action on the memory cell. Consequently, the amplitude of the fifth erase pulse is 4Vdd.

At the time point t8, the control circuit performs the erase verifying action. The result of the erase verifying action indicates that the memory cell passes the first-stage verification test (pass1) but does not pass the second-stage verification test (fail2). Then, the control circuit will perform the searching process B.

At the time point t9, the control circuit performs the searching process B. The control circuit generates a sixth erase pulse and performs the erase action on the memory cell. Consequently, the amplitude of the sixth erase pulse is 4Vdd, and the pulse width Wd is increased by one increment ΔW.

At the time point ta, the control circuit performs the erase verifying action. The result of the erase verifying action indicates that the memory cell does not pass the second-stage verification test (fail2). At the time point tb, the control circuit generates a seventh erase pulse and performs the erase action on the memory cell. Consequently, the amplitude of the seventh erase pulse is 4Vdd, and the pulse width Wd is further increased by one increment ΔW.

At the time point tc, the control circuit performs the erase verifying action. The result of the erase verifying action indicates that the memory cell does not pass the second-stage verification test (fail2). At the time point td, the control circuit generates an eighth erase pulse and performs the erase action on the memory cell. Consequently, the amplitude of the eighth erase pulse is 4Vdd, and the pulse width Wd is further increased by one increment ΔW.

At the time point te, the control circuit performs the erase verifying action. The result of the erase verifying action indicates that the memory cell passes the second-stage verification test (pass2). Consequently, the target value of the erase voltage Ves is 4Vdd.

Figure 4D:
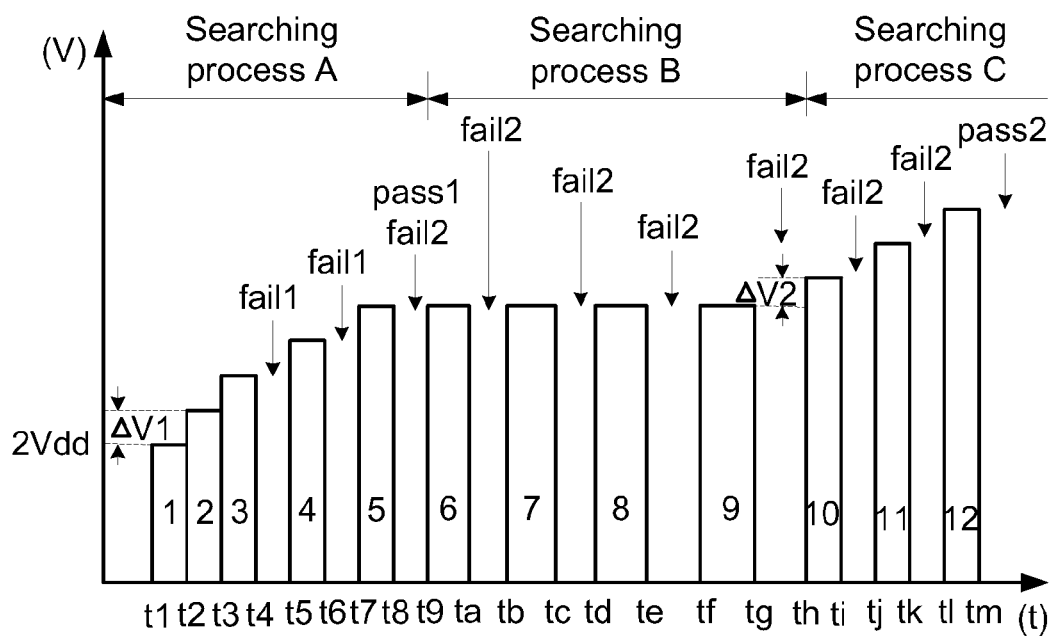

A method of acquiring the erase voltage in the searching process A, the searching process B and the searching process C is shown in FIG. 4D. In the time interval between the time point t1 and the time point t4, the control circuit generates three consecutive erase pulse (n=3) and performs the erase action three times. Consequently, the amplitudes of the three erase pulses are 2Vdd, 2.5Vdd and 3Vdd, respectively.

At the time point the time point t4, the control circuit performs the erase verifying action. The result of the erase verifying action indicates that the memory cell does not pass the first-stage verification test (fail1). At the time point t5, the control circuit generates a fourth erase pulse and performs the erase action on the memory cell. Consequently, the amplitude of the fourth erase pulse is 3.5Vdd.

At the time point t6, the control circuit performs the erase verifying action. The result of the erase verifying action indicates that the memory cell does not pass the first-stage verification test (fail1). At the time point t7, the control circuit generates a fifth erase pulse and performs the erase action on the memory cell. Consequently, the amplitude of the fifth erase pulse is 4Vdd.

At the time point t8, the control circuit performs the erase verifying action. The result of the erase verifying action indicates that the memory cell passes the first-stage verification test (pass1) but does not pass the second-stage verification test (fail2). Then, the control circuit will perform the searching process B.

At the time point t9, the control circuit performs the searching process B. The control circuit generates a sixth erase pulse and performs the erase action on the memory cell. Consequently, the amplitude of the sixth erase pulse is 4Vdd, and the pulse width Wd is increased by one increment ΔW.

At the time point ta, the control circuit performs the erase verifying action. The result of the erase verifying action indicates that the memory cell does not pass the second-stage verification test (fail2). At the time point tb, the control circuit generates a seventh erase pulse and performs the erase action on the memory cell. Consequently, the amplitude of the seventh erase pulse is 4Vdd, and the pulse width Wd is further increased by one increment ΔW.

At the time point tc, the control circuit performs the erase verifying action. The result of the erase verifying action indicates that the memory cell does not pass the second-stage verification test (fail2). At the time point td, the control circuit generates an eighth erase pulse and performs the erase action on the memory cell. Consequently, the amplitude of the eighth erase pulse is 4Vdd, and the pulse width Wd is further increased by one increment ΔW.

At the time point te, the control circuit performs the erase verifying action. The result of the erase verifying action indicates that the memory cell does not pass the second-stage verification test (fail2). At the time point tf, the control circuit generates a ninth erase pulse and performs the erase verifying action. Consequently, the amplitude of the ninth erase pulse is 4Vdd, and the pulse width Wd is further increased by one increment ΔW.

At the time point tg, the control circuit performs the erase verifying action. The result of the erase verifying action indicates that the memory cell does not pass the second-stage verification test (fail2). Meanwhile, the pulse number of the erase pulse is 9 (m=9). Then, the control circuit will perform the searching process C.

At the time point th, the control circuit performs the searching process C. The control circuit generates a tenth erase pulse and performs the erase action on the memory cell. Consequently, the amplitude of the tenth erase pulse is 4.3Vdd (=4Vdd+ΔV2), and the pulse width is equal to the preset pulse width Wd.

At the time point ti, the control circuit performs the erase verifying action. The result of the erase verifying action indicates that the memory cell does not pass the second-stage verification test (fail2). At the time point tj, the control circuit generates an eleventh erase pulse and performs the erase verifying action. Consequently, the amplitude of the eleventh erase pulse is 4.6Vdd (=4Vdd+2ΔV2), and the pulse width is equal to the preset pulse width Wd.

At the time point tk, the control circuit performs the erase verifying action. The result of the erase verifying action indicates that the memory cell does not pass the second-stage verification test (fail2). At the time point tl, the control circuit generates a twelfth erase pulse and performs the erase verifying action. Consequently, the amplitude of the twelfth erase pulse is 4.9Vdd (=4Vdd+3ΔV2), and the pulse width is equal to the preset pulse width Wd.

At the time point tm, the control circuit performs the erase verifying action. The result of the erase verifying action indicates that the memory cell passes the second-stage verification test (pass2). Consequently, the target erase voltage Ves is 4.9Vdd.

From the above descriptions, the present invention provides a control voltage searching method for a non-volatile memory. The control voltage searching method can be applied to the electronic devices that are powered by a wide range power voltage. In case that a control circuit of the electronic device is unable to realize the accurate magnitude of the power voltage Vdd, the control circuit increases a control voltage gradually and performs a control action and a verifying action on the non-volatile memory. Consequently, the target control voltage for the non-volatile memory is searched.

In the above embodiment, the memory cell is composed of N-type electronic components. Moreover, the increments ΔV1, ΔV2 and ΔW1 are positive. It is noted that numerous modifications and alterations may be made while retaining the teachings of the invention. For example, in another embodiment, the memory cell is composed of P-type electronic components. Moreover, the increments ΔV1, ΔV2 and ΔW1 may be negative.

Figure 5A:
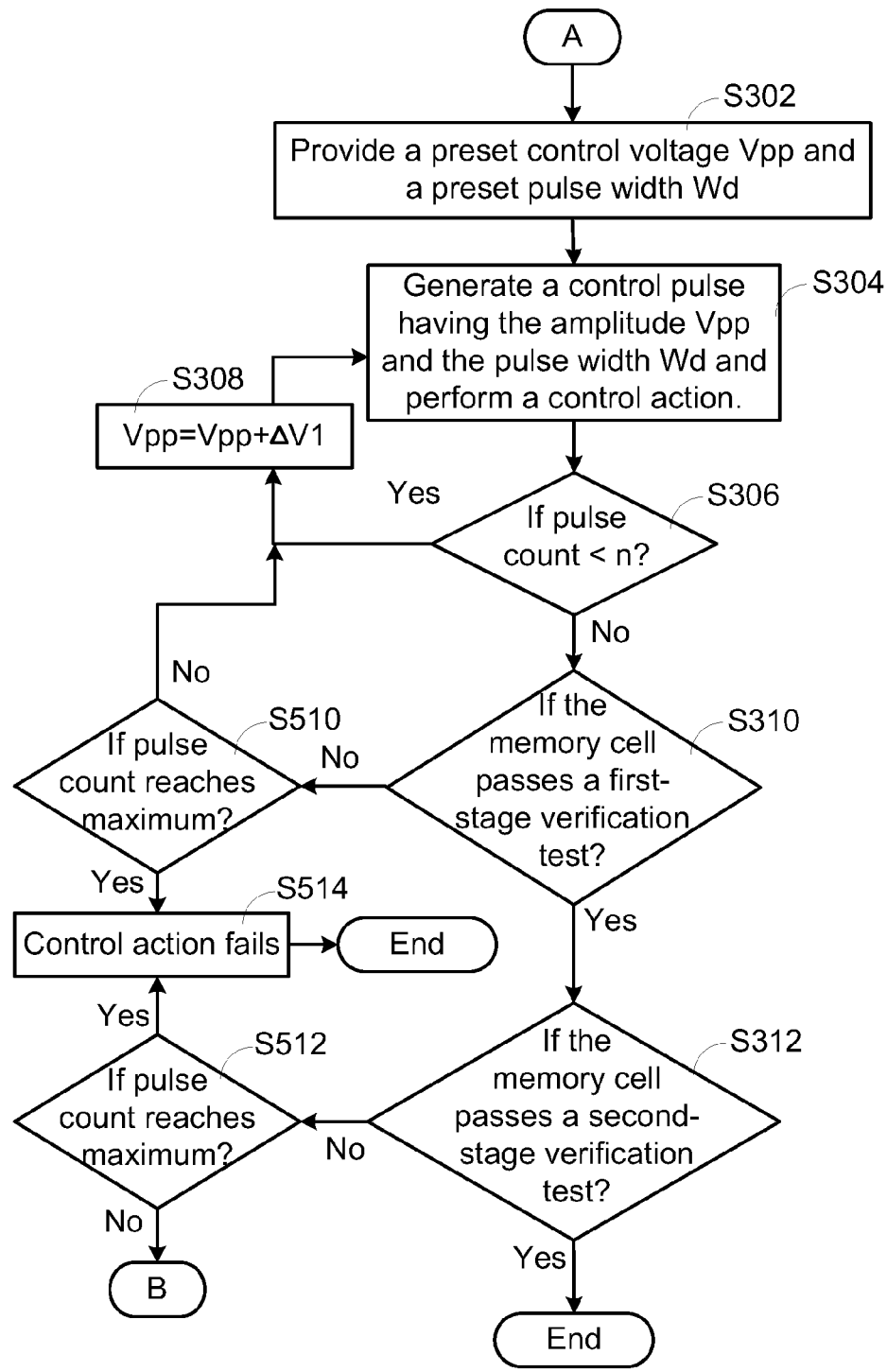
FIGS. 5A, 5B and 5C schematically illustrate a control voltage searching method for a non-volatile memory according to the second embodiment of the present invention.
Figure 5C:
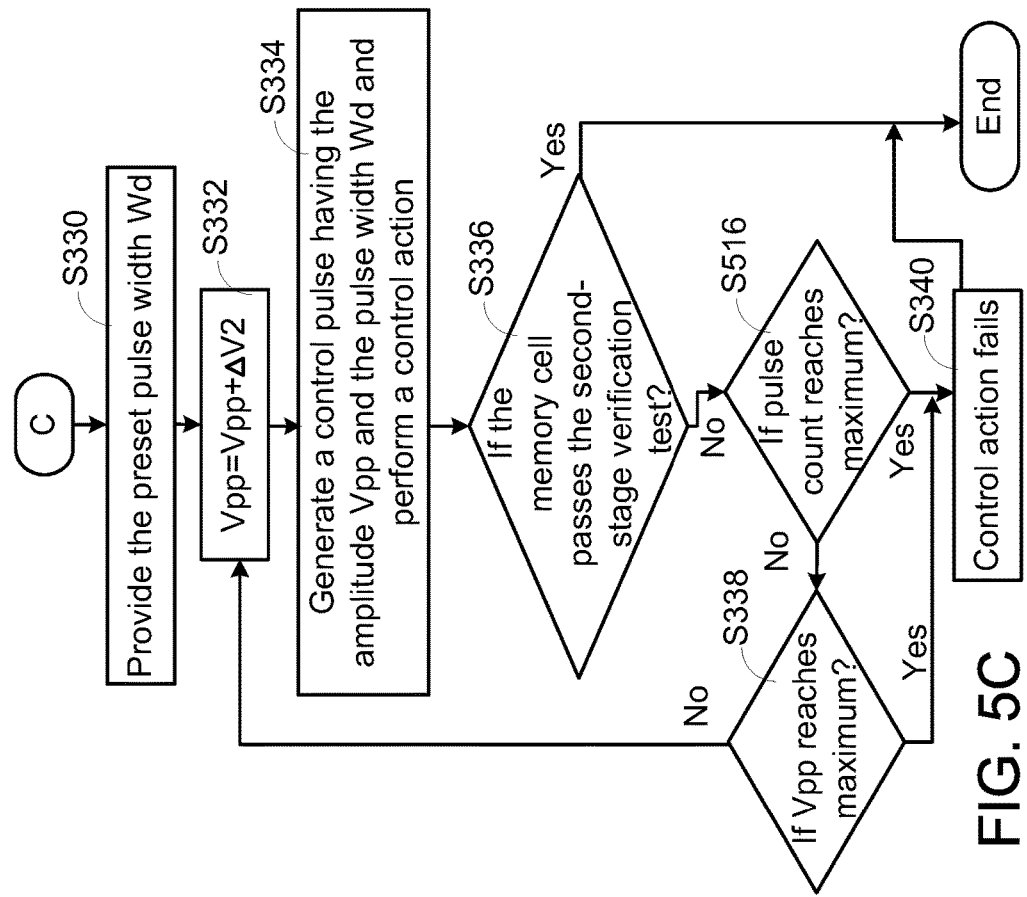
Figure 5B:
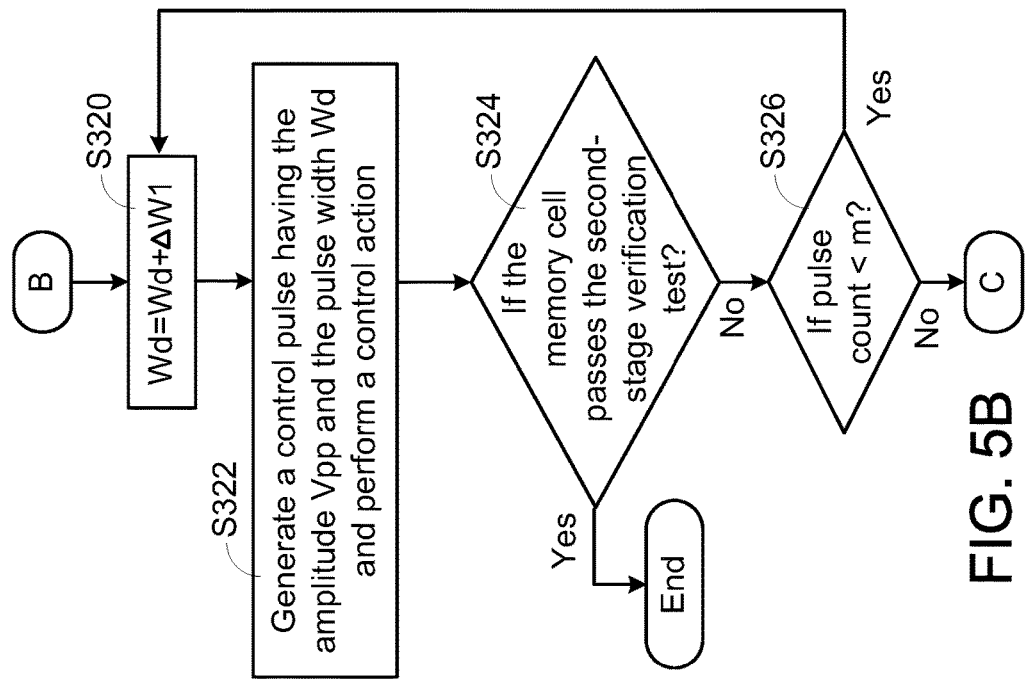

FIGS. 5A, 5B and 5C schematically illustrate a control voltage searching method for a non-volatile memory according to the second embodiment of the present invention. In comparison with the first embodiment, Steps S510~S516 are newly added to make sure the searching process can be terminated in an acceptable time period. The other steps are the same with FIGS. 3A-3C, and are not redundantly described herein.

In the second embodiment, if the memory cell cannot pass the first-stage verification test (S310), the control circuit judges whether the pulse count reaches a maximum pulse count (Step 510). If the pulse count does not reach the maximum pulse count, Step S308 is done to update the control voltage Vpp. Whereas, if the pulse count reaches the maximum pulse count, the control circuit confirms that the control action fails (Step S514) and ends the flowchart. The number 30 maybe set as the maximum pulse count.

Furthermore, if the memory cell cannot pass the second-stage verification test (S312), the control circuit judges whether the pulse count reaches a maximum pulse count (Step 512). If the pulse count does not reach the maximum pulse count, the control circuit will perform the searching process B. Whereas, if the pulse count reaches the maximum pulse count, the control circuit confirms that the control action fails (Step S514) and ends the flowchart.

Moreover, if the memory cell cannot pass the second-stage verification test (S336), the control circuit judges whether the pulse count reaches a maximum pulse count (Step 516). If the pulse count does not reach the maximum pulse count, the control circuit will perform the judging step (S338). Whereas, if the pulse count reaches the maximum pulse count, the control circuit confirms that the control action fails (Step S340) and ends the flowchart.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A control voltage searching method for a non-volatile memory, the control voltage searching method comprising steps of:
   (a1) providing a preset control voltage and a preset pulse width;
   (a2) generating a control pulse according to the control voltage and the pulse width and performing a control action on a memory cell, wherein an amplitude of the control pulse is equal to the control voltage;
   (a3) judging whether a pulse count of the control pulse is smaller than a first number, wherein if the pulse count of the control pulse is smaller than the first number, the control voltage plus a first increment is set as an updated value of the control voltage, and the step (a2) is repeatedly done, wherein if the pulse count of the control pulse is not smaller than the first number, a first-stage verifying action is performed to judge whether the memory cell passes a first-stage verification test;
   (a4) if the memory cell does not pass the first-stage verification test, setting the updated value of the control voltage by adding the first increment to the control voltage, and performing the step (a2) again, wherein if the memory cell passes the first-stage verification test, a second-stage verifying action is performed to judge whether the memory cell passes a second-stage verification test; and (a5) if the memory cell passes the second-stage verification test, acquiring a target value of the control voltage according to the updated value of the control voltage.

2. The control voltage searching method as claimed in claim 1, wherein the control voltage is an erase voltage, the control pulse is an erase pulse, the control action is an erase action, the first-stage verifying action is a first-stage erase verifying action, and the second-stage verifying action is a second-stage erase verifying action.

3. The control voltage searching method as claimed in claim 2, wherein the memory cell comprises:
a select transistor, wherein a first source/drain terminal of the select transistor is connected with a source line, and a gate terminal of the select transistor is connected with a select gate line;
a switch transistor, wherein a first source/drain terminal of the switch transistor is connected with a bit line, and a gate terminal of the switch transistor is connected with a word line;
a floating gate transistor, wherein a first source/drain terminal of the floating gate transistor is connected with a second source/drain terminal of the select transistor, and a second source/drain terminal of the floating gate transistor is connected with a second source/drain terminal of the switch transistor;
a first capacitor connected between a floating gate of the floating gate transistor and a control line; and
a second capacitor connected between the floating gate of the floating gate transistor and an erase line.

4. The control voltage searching method as claimed in claim 3, wherein while the erase action is performed, a ground voltage is provided to the control line, the bit line and the source line, the erase voltage is provided to the erase line, and a power voltage is provided to the word line and the select gate line.

5. The control voltage searching method as claimed in claim 3, wherein while the first-stage erase verifying action and the second-stage erase verifying action are performed, a ground voltage is provided to the control line, the erase line and the source line, a power voltage is provided to the word line and the select gate line, and a bias voltage is provided to the bit line.

6. The control voltage searching method as claimed in claim 1, wherein if an on current generated by the memory cell is higher than a first current value, the memory cell passes the first-stage verification test, wherein if the on current generated by the memory cell is higher than a second current value, the memory cell passes the second-stage verification test, wherein the second current value is higher than the first current value.

7. The control voltage searching method as claimed in claim 1, wherein the control voltage is a program voltage, the control pulse is a program pulse, the control action is a program action, the first-stage verifying action is a first-stage program verifying action, and the second-stage verifying action is a second-stage program verifying action.

8. The control voltage searching method as claimed in claim 7, wherein the memory cell comprises:
a select transistor, wherein a first source/drain terminal of the select transistor is connected with a source line, and a gate terminal of the select transistor is connected with a select gate line;
a switch transistor, wherein a first source/drain terminal of the switch transistor is connected with a bit line, and a gate terminal of the switch transistor is connected with a word line;
a floating gate transistor, wherein a first source/drain terminal of the floating gate transistor is connected with a second source/drain terminal of the select transistor, and a second source/drain terminal of the floating gate transistor is connected with a second source/drain terminal of the switch transistor;
a first capacitor connected between a floating gate of the floating gate transistor and a control line; and
a second capacitor connected between the floating gate of the floating gate transistor and an erase line.

9. The control voltage searching method as claimed in claim 8, wherein while the program action is performed, a program voltage is provided to the control line and the erase line, a ground voltage is provided to the bit line and the source line, and a power voltage is provided to the word line and the select gate line.

10. The control voltage searching method as claimed in claim 8, wherein while the first-stage program verifying action and the second-stage program verifying action are performed, a power voltage is provided to the control line, the erase line, the word line and the select gate line, a ground voltage is provided to the source line, and a bias voltage is provided to the bit line.

11. The control voltage searching method as claimed in claim 8, wherein while the first-stage program verifying action or the second-stage program verifying action is performed, the memory cell passes the verification test if the off current generated by the memory cell is lower than an acceptance level, wherein when performing the first-stage program verifying action, a first voltage is provided to the control line and the erase line EL while when performing the second-stage program verifying action, a second voltage is provided to the control line and the erase line EL, wherein the first voltage is smaller than the second voltage.

12. The control voltage searching method as claimed in claim 1, wherein if an off current generated by the memory cell is lower than a first current value, the memory cell passes the first-stage verification test, wherein if the off current generated by the memory cell is lower than a second current value, the memory cell passes the second-stage verification test, wherein the second current value is lower than the first current value.

13. The control voltage searching method as claimed in claim 1, further comprising a step of: (a6) if the memory cell does not pass the second-stage verification test, judging whether the pulse count reaches a maximum pulse count, wherein if the pulse count reaches a maximum pulse count, the control action fails.

14. The control voltage searching method as claimed in claim 1, wherein the step of (a5) further comprises steps of:
judging whether the pulse count reaches a maximum pulse count;
setting the updated value of the control voltage by adding the first increment to the control voltage, and performing the step (a2) if the pulse count does not reach the maximum pulse count; and
confirming that the control action fails if the pulse count reaches the maximum pulse count.

15. The control voltage searching method as claimed in claim 1, wherein if the memory cell does not pass the second-stage verification test, the control voltage searching method further comprises steps of:
(b1) setting the pulse width plus a second increment as an updated value of the pulse width;
(b2) generating the control pulse according to the updated value of the control voltage and the updated value of the pulse width, performing the control action on the memory cell, and performing the second-stage verifying action to judge whether the memory cell passes the second-stage verification test;

(b3) if the memory cell does not pass the second-stage verification test and the pulse count is smaller than a second number, performing the step (b1) again; and (b4) if the memory cell passes the second-stage verification test, acquiring the target value of the control voltage according to the updated value of the control voltage.

16. The control voltage searching method as claimed in claim 13, wherein if the memory cell does not pass the second-stage verification test and the pulse count is not smaller than a second number, the control voltage searching method further comprises steps of:

(c1) providing the preset pulse width;

(c2) setting the control voltage plus a third increment as the updated value of the control voltage;

(c3) generating the control pulse according to the updated value of the control voltage and the pulse width, performing the control action on the memory cell, and performing the second-stage verifying action to judge whether the memory cell passes the second-stage verification test;

(c4) if the memory cell does not pass the second-stage verification test and the updated value of the control voltage does not reach a maximum value, performing the step (c2) again;

(c5) if the memory cell does not pass the second-stage verification test and the updated value of the control voltage reaches maximum value, confirming that the control action fails; and (c6) if the memory cell passes the second-stage verification test, acquiring the target value of the control voltage according to the updated value of the control voltage.

17. The control voltage searching method as claimed in claim 16, further comprising a step of: (a7) if the memory cell does not pass the second-stage verification test and the pulse count reaches a maximum pulse count, confirming that the control action fails.

* * * * *